(12) United States Patent
Noble

(10) Patent No.: US 6,316,305 B1
(45) Date of Patent: Nov. 13, 2001

(54) COMPACT SRAM CELL USING TUNNEL DIODES

(75) Inventor: Wendell P. Noble, Milton, VT (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 09/195,163

(22) Filed: Nov. 18, 1998

(51) Int. Cl.$^7$ ............................................. H01L 21/8234
(52) U.S. Cl. ..................... 438/237; 438/153; 438/199; 438/215; 438/167
(58) Field of Search ..................... 438/237, 153, 438/199, 215, 167, 172, 158, 238; 365/369, 185.24, 185.21, 185.29, 281, 185.3

(56) References Cited

U.S. PATENT DOCUMENTS 5,032,891 * 7/1991 Takagi et al. ........................ 257/350
5,594,683 1/1997 Chen et al. .
5,976,926 * 11/1999 Wu et al. ............................. 438/237

OTHER PUBLICATIONS

Jack Y–C. Sun, 1997 International Symposium on VLSIT Technology, Systems and Applications, Digest of Technical Papers, pp. 293–297.
S.D. Malaviya, Single Device DC Stable Memory Cell, IBM Technical Disclosure Bulletin, U20U, No. 9, Feb. 1978.
Koji Sakui et. al. A New Static Memory Cell Based on Reverse Base Current (RBC) Effect of IBipolar Transistors, 1988 IEDM, IDigest of Technical Papers, pp. 44–47.
D. Chin and H. matino, IBM Technical Disclosure Bulletin, 28, No. 12, May 1986, pp. 5522, 5523, Static RAM Cell Configuration.
J.P.A. van der Wagt et. al. IEEE Electron Device Letters, 19, No. 1. Jan. 1998, pp. 7–9, RTD/HFET Low Standby Power SRAM GAin Cell.
R.A. Logan et. al. Journal of Applied Phyusics, 32, No. 7, Jul. 1961, pp. 1201–1206, Electron Bombardment Damage in Silicon Esaki Diodes.

* cited by examiner

Primary Examiner—Matthew Smith
Assistant Examiner—Igwe U. Anya
(74) Attorney, Agent, or Firm—Dickstein Shapiro Morin & Oshinsky LL

(57) ABSTRACT

The present invention provides a compact structure for the above-discussed SRAM cell as well as a method for fabricating the structure. The structure is preferably implemented in silicon. The standby power consumption of the cell is only approximately 0.5 nanowatts. The cell structure allows an SRAM cell to be fabricated in only a 16 feature-square area using planar technology. The structure of the cell according to one embodiment of the present invention is comprised of two bus bars of minimum feature size width, each of which has a tunnel diode implanted therein, and an elongated center land area (also of minimum feature size width) between the two bus bars. The transistor is constructed along the elongated center land area. In a preferred embodiment, transistors of neighboring cells share a common drain area and bit line contact. A corresponding method for fabricating the structure is also provided.

40 Claims, 8 Drawing Sheets

COMPACT SRAM CELL USING TUNNEL DIODES

BACKGROUND OF THE INVENTION

1. Field of the Invention

The present invention relates generally to the field of integrated circuit fabrication, and more specifically to a structure for static random access memory cells with tunnel diodes and a method for making the same.

2. Description of the Related Art

The traditional SRAM cell consists of six transistors configured as cross-coupled inverters to form a flip-flop. The minimum attainable cell size has remained at approximately 120 $F^2$ (where F denotes the feature size—the minimum line width and/or minimum space between lines) using standard planar technology. The drive to achieve further reductions in cell size has led to the use of vertical transistors, but even with this technology, which is more complicated and hence more costly, the feature size cannot be reduced to below 32 $F^2$. Thus, although absolute SRAM cell size can be improved with reductions in feature size corresponding to advances in lithography technology, further reductions in SRAM cell size require changes in cell configuration. As used herein, cell configuration refers to the components (e.g. transistors, diodes) of the cell and their interconnection. Configuration has a different meaning from structure. Structure, as used herein, refers to the physical topography of the fabricated cell.

Several different SRAM cell configurations have been proposed. Some of these new structures exploit latchup as a mechanism of cell operation. Other new SRAM cell configurations make use of bipolar base current reversal. Examples of such configurations can be found in Koji Sakui et al., *A New Static Memory Cell Based on Reverse Base Current (RBC) Effect of Bipolar Transistors*, 1988 IEDM Digest of Technical Papers, pp. 44–47, and in U.S. Pat. No. 5,594,683. These and other new SRAM cell configurations do achieve smaller cell size.

Each of these alternative configurations, however, suffers from an important drawback—high standby power consumption. Standby power consumption is the amount of power used by a cell when neither read nor write accesses are occurring. This drawback is especially problematic in situations such as BBRAM (battery backed-up RAM) where low standby power consumption is crucial.

Another alternative configuration is disclosed in van der Wagt et al., *RTD/HFET Low Standby Power SRAM Gain Cell*, IEEE Electron Device Letters, vol. 19, No. 1 (January, 1988). This configuration uses only two tunnel diodes and a single FET, but still suffers from relatively high standby power consumption (approximately 50 nanowatts per cell). The high standby power consumption is partially due to the fact that the cell described in van der Wagt is fabricated using III–V technology (integrated circuits fabricated on substrates such as GaAs comprising combinations of elements from groups III and V of the periodic table).

A circuit diagram of this SRAM cell 10 is shown in FIG. 1. Two tunnel diodes 14, 16 are connected in series between a voltage source 12 and ground such that the diodes 14, 16 are both forward biased. The storage node 15 between the diodes 14, 16 is connected to the drain 18a of a field effect transistor 18. The source 18b of transistor 18 is connected to the bit line 20, while the gate 18c of transistor 18 is connected to the word line 22. In this configuration, the transistor 18 allows access to the storage node 15 much as a transistor controls access to a storage capacitor in a conventional DRAM cell.

FIG. 2 is a plot of the current vs. voltage characteristic curve 40 of the tunnel diodes 14, 16. The vertical axis 42 is in milliamps, while the horizontal axis 44 is in volts. The curve 40 exhibits a relative minimum, or valley, current at approximately 0.3 volts (point A in FIG. 2). As can be seen from line 46, this same current also occurs at a forward bias of approximately 0.02 volts (point B in FIG. 2). Thus, a combination of two diodes 14, 16 forward biased in series with a total bias of 0.32 volts will have a current equal to the valley current indicated by line 46, with 0.3 volts across one diode and 0.02 volts across the other. Since either diode can have either voltage, two stable states for the diode 14, 16 combination exist. The node 15 thus acts as the storage node, which can remain stable at either 0.3 or 0.02 volts. The stability of the cell states is determined by the value of the voltage across the diode pair 14, 16 as illustrated in FIG. 3. The node 15 can be set to either of these states by applying the desired voltage to the bit line 20 and raising the word line 22 voltage to turn on the access transistor 18. Reading may be accomplished as in a DRAM cell by using voltage sense amplifier to sense the voltage on the bit line 20 after raising the word line 22 voltage to connect the node 15 to the bit line 20. Because the node 15 is in a self-sustaining stable voltage state, current sensing may also be used to read the cell state.

What is needed is a compact cell structure and corresponding fabrication method that realizes the above-discussed SRAM circuit configuration in a small amount of space while improving standby mode power consumption.

SUMMARY OF THE INVENTION

The present invention provides a compact structure for the above-discussed SRAM cell as well as a method for fabricating the structure. The structure is implemented in silicon (rather than III–V) technology which results in a reduced standby power consumption of only approximately 0.5 nanowatts. The cell structure realizes an SRAM cell with only a 16 $F^2$ area using planar technology. The structure of the cell according to one embodiment of the present invention is comprised of first and second voltage bus bars of approximately minimum feature size width, each of which has a tunnel diode formed therein, and an elongated center land area (also of minimum feature size width) between the two bus bars. The transistor is constructed along the elongated center land area. In a preferred embodiment, transistors of neighboring cells share a common drain area and bit line contact. A corresponding method for fabricating the structure is also disclosed.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF THE PREFERRED EMBODIMENTS

The present invention will be illustrated through a description of a two-cell SRAM structure and corresponding method for fabricating said structure. Numerous specific details, such as materials, thicknesses, etc., are set forth in order to provide a thorough understanding of the present invention. It will be obvious, however, to one skilled in the art that the present invention is capable of many different embodiments and that the present invention may be practiced without the specific details set forth herein. Accordingly, the drawings and description herein are to be regarded as illustrative in nature and not as restrictive.

The term "wafer" is to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in the base semiconductor structure or foundation. In addition, the semiconductor need not be silicon-based, but could be based on silicon-germanium, germanium, or gallium arsenide.

Figure 4:
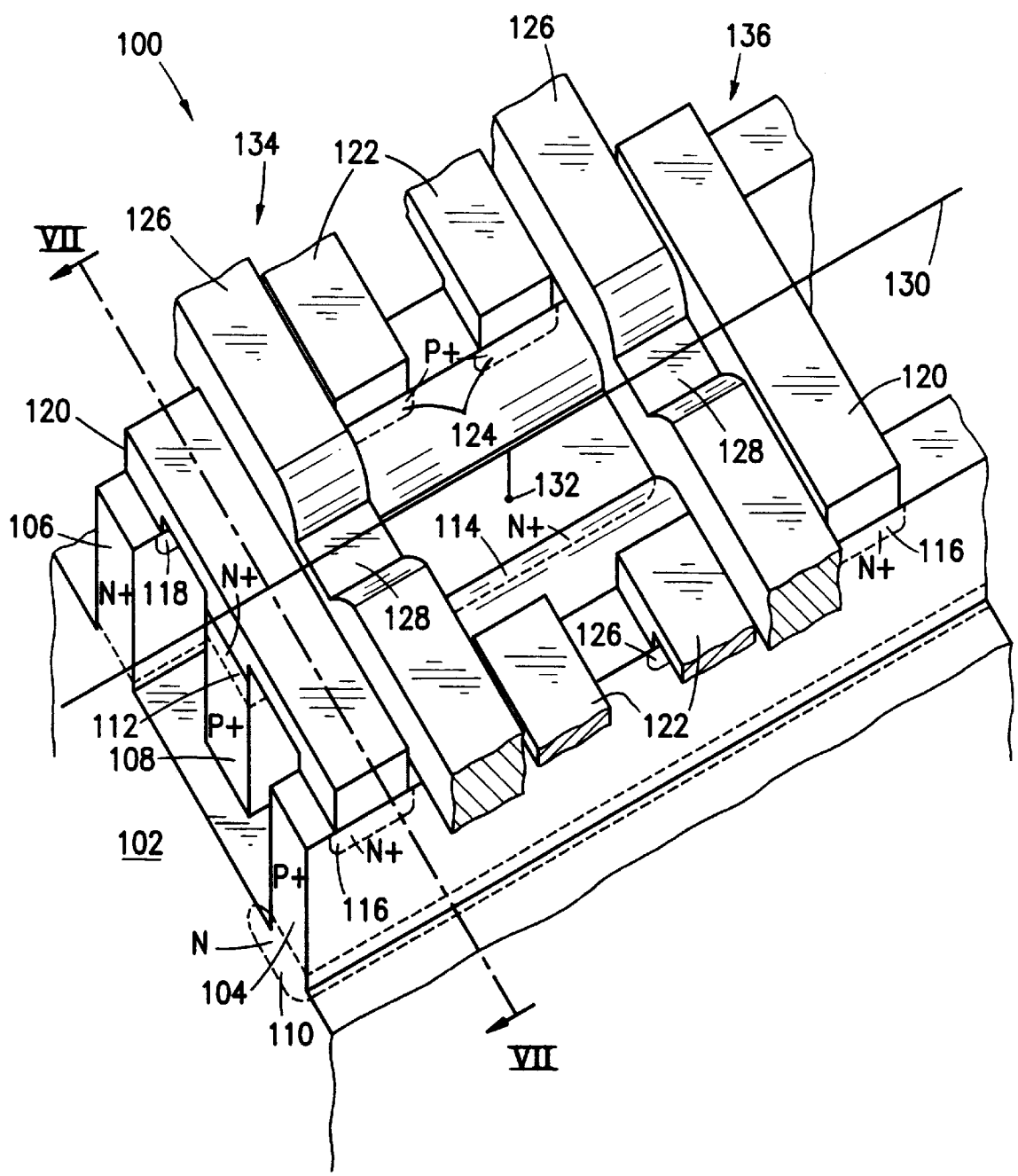
FIG. 4 is a perspective view of a silicon wafer with a structure corresponding to a pair of SRAM cells according to one embodiment of the present invention thereon.

A perspective view of a two-cell SRAM structure 100 according to one embodiment of the present invention is illustrated in FIG. 4. The structure 100 is formed on a wafer 102. The wafer 102 is preferably comprised of p-type silicon. The structure 100 comprises a first voltage bus 104 (which is at approximately +0.32 volts in the preferred embodiment) and a second voltage bus 106, which is at ground in the preferred embodiment. The width of each bus 102, 104 is either approximately or exactly the minimum feature size. The structure 100 also comprises a device land 108 located between the buses 104, 106, which also has a width approximately equal to the minimum feature size. The buses 104, 106 and device lands 108 are formed from wafer 102 using an STI (shallow trench isolation) process. In contrast to the buses 104, 106, which are continuous between many cells, the device land 108 extends only the length of the two cells illustrated in FIG. 4. The space between the first voltage bus 104 and the device land 108, as well as the space between the device land 108 and the second voltage bus 106 is also approximately equal to the minimum feature size. Although not shown in FIG. 4, these spaces are filled in with oxide insulators to isolate the buses 104, 106 and device land 108.

Figure 1:
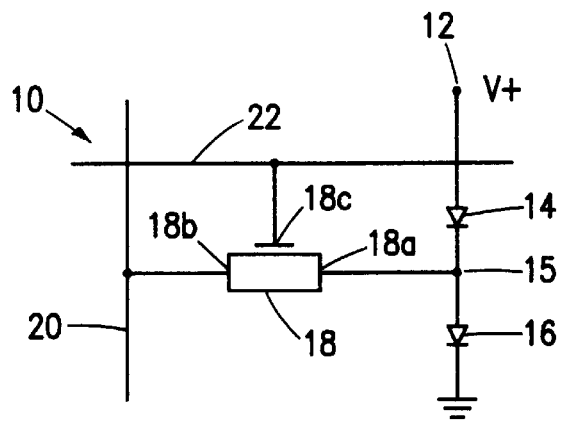
FIG. 1 is circuit diagram of an SRAM cell.
Figure 2:
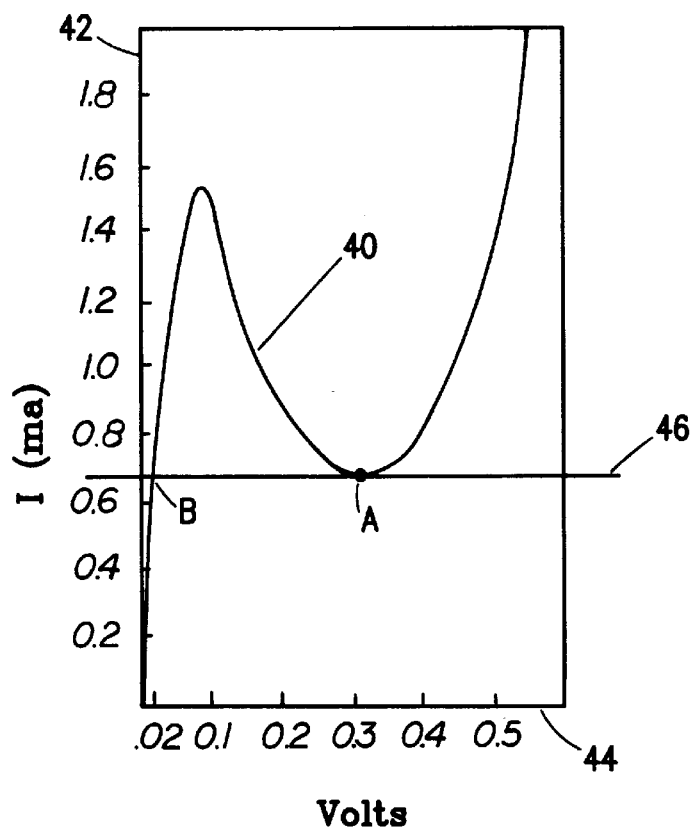
FIG. 2 is a characteristic curve of a silicon tunnel diode used in the circuit of FIG. 1.
Figure 3:
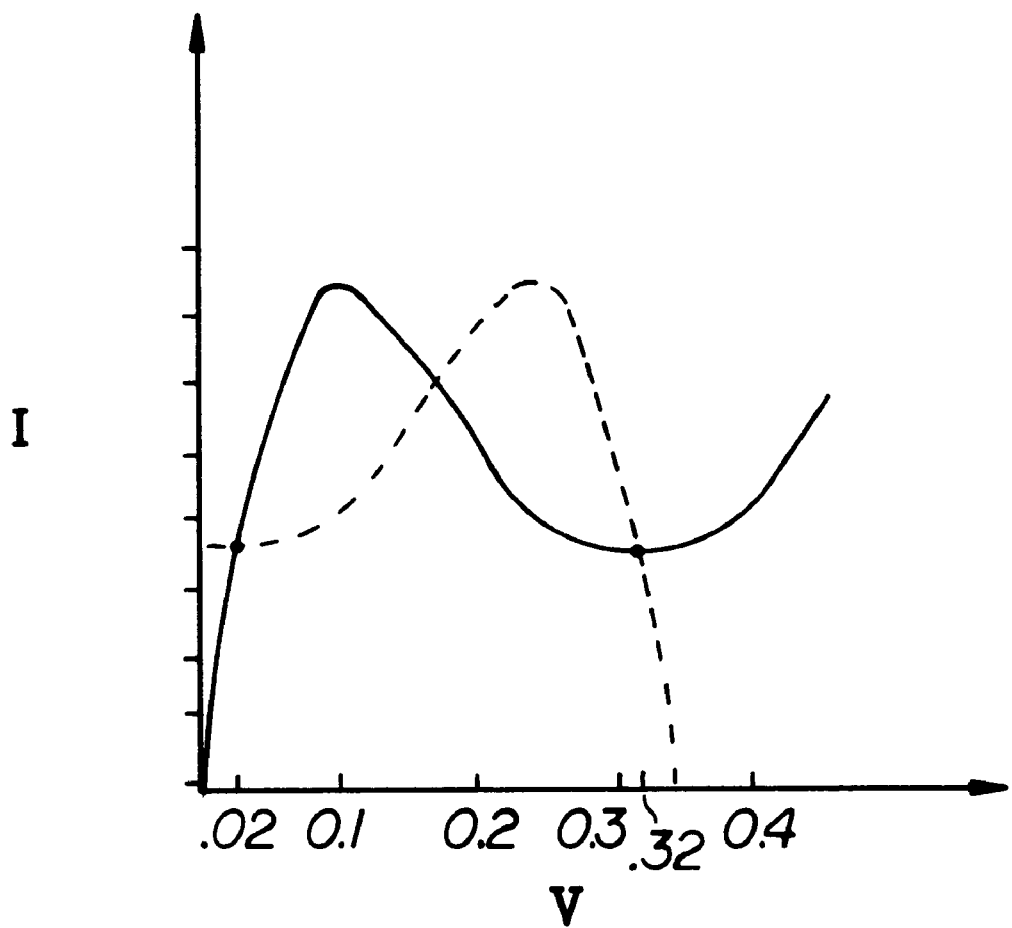
FIG. 3 is a load line diagram of the diodes included in the circuit of FIG. 1.
Figure 12:
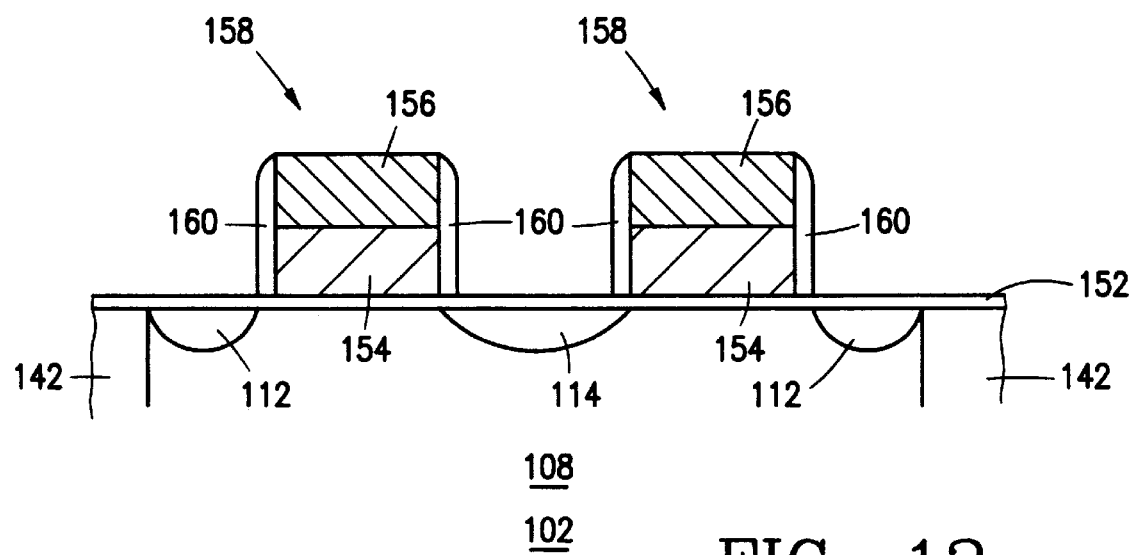
FIG. 12 is a cross-sectional view of the wafer of FIG. 11 at a later stage of processing.

The first voltage bus 104 is comprised of p-type silicon, which is separated from the p-type silicon wafer by a thin n-type layer 110 beneath the first voltage bus 104 to isolated it from the p-type silicon wafer substrate 102. The second voltage bus 106 is formed of n-type material. The device land 108 is formed of the same p-type material as the wafer 102. Source regions 112 and drain regions 114 are formed in device land 108. The drain region 114 is common to both cells illustrated in FIG. 4. An n-type region 116 is formed in the p-type material of first voltage bus 104 to form a first p-n junction tunnel diode. A p-type region 118 is formed in the n-type second voltage bus 106 to form a second p-n junction tunnel diode. The first tunnel diode corresponds to diode 14 from FIG. 1, while the second tunnel diode corresponds to diode 16 of FIG. 1. The n-type region 116 of the first tunnel diode is connected to the p-type region 118 of the second tunnel diode (such that both diodes are forward-biased) by a metal node strap 120 (corresponding electrically to node 15 of FIG. 1), which is also connected to the source region 112. A word line 126 includes a gate region 128 between the source region 112 and drain region 114 such that a field effect transistor (corresponding to transistor 18 in FIG. 1) is formed. Not shown in FIG. 4 for the sake of clarity, but shown in FIG. 12, are nitride insulators 160 along the sides of the word line 126 that electrically isolate the word line 126 from neighboring node straps 120. Also shown in FIG. 4 are portions of node straps 122, p-type regions 124 and n-type regions 126 from neighboring SRAM cells. Finally, shown schematically in FIG. 4 is a bit line 130 and a bit line contact 132. The structure on the right side of the bit line contact 132 forms a first SRAM cell 136 while the structure on the left side of the bit line contact 132 forms a second SRAM cell 134.

Figure 5:
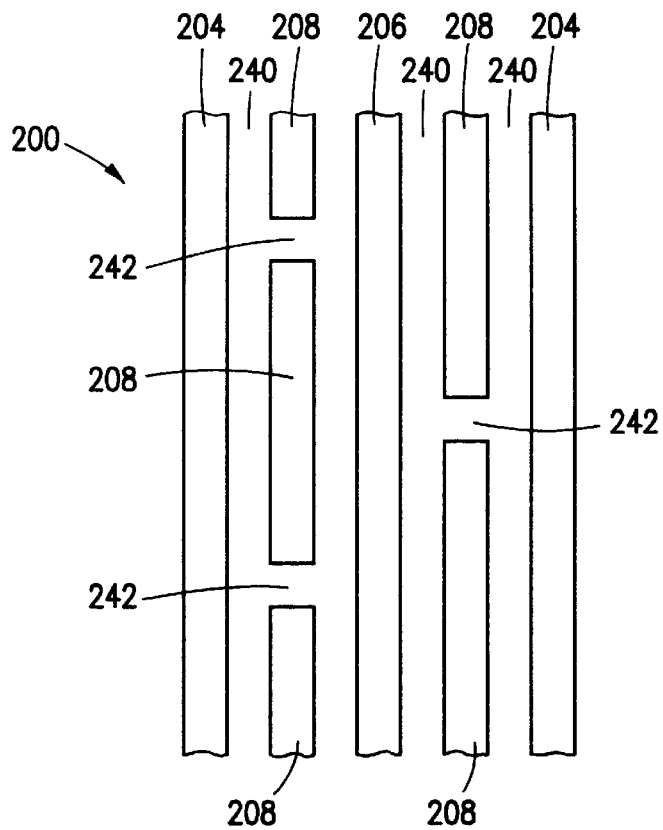
FIG. 5 is a mask used in the fabrication of the structure of FIG. 4.

FIG. 5 illustrates a portion 200 of a mask used to form the buses 104, 106 and device lands 108 in the wafer 102 of FIG. 4. Mask regions 208 correspond to device lands 108 from FIG. 4. Mask regions 204 correspond to the first voltage bus 104 of FIG. 4. Mask region 206 corresponds to the second voltage bus 106 of FIG. 4. As will be explained in further detail below, the spaces between mask regions 204, 206 and 208 are etched away from the substrate 102 and filled in with oxide insulators using a standard STI process as mentioned above. Mask regions 204, 208 and 208, as well as vertical spaces 240 and horizontal spaces 242 between them are all 1F in width.

Figure 6:
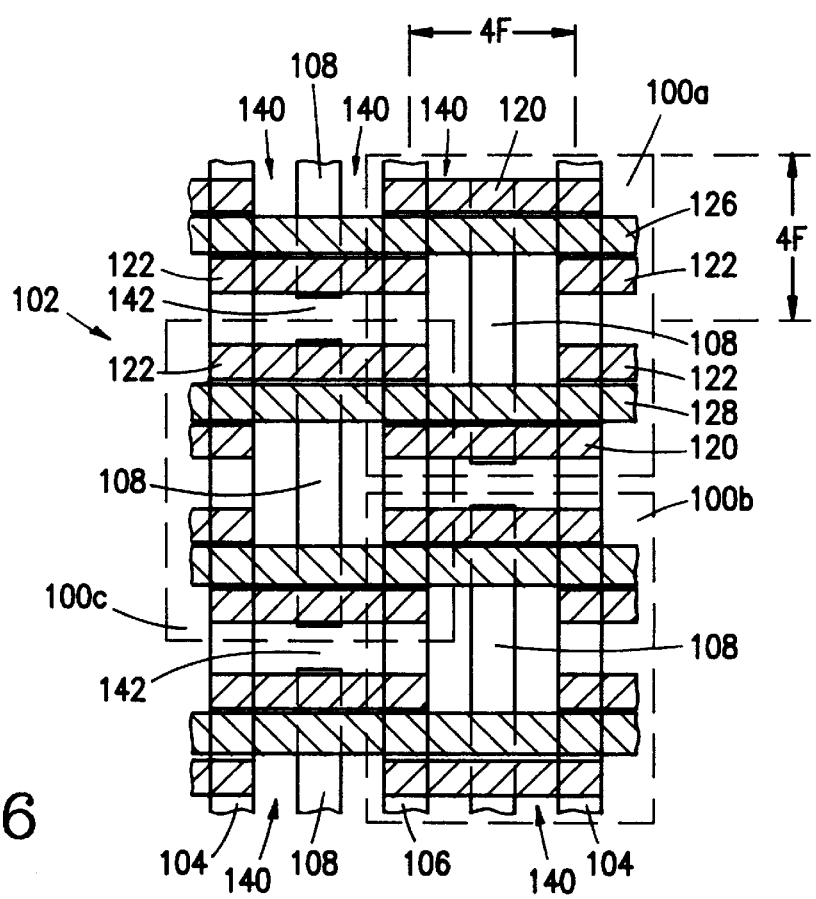
FIG. 6 is a top view of the wafer of FIG. 4 at an early stage of processing according to one embodiment of the present invention.

FIG. 6 illustrates a top view (in reduced detail) of the wafer 102 of FIG. 4. The portion of the wafer 102 illustrated in FIG. 6 is larger than the portion illustrated in FIG. 4. Several SRAM cell pair structures 100a, 100b, 100c are contained on the wafer 102 portion of FIG. 6. The wafer 102 portion includes several device lands 108 as well as two first voltage bus bars 104 and a second voltage bus bar 106. Referring now to the SRAM cell pair designated 100a, two node straps 120, two word lines 128, and several node strap portions 122 are shown. It is evident from FIG. 6 that first voltage buses 104 and second voltage buses 106 are shared by neighboring pairs of SRAM cells, such that horizontally neighboring cell pairs have "mirror image" structures (e.g. cell pair 100a has its second voltage bus 106 to the left, while that same second voltage bus 106 is on the right for cell pair 100c).

The SRAM cell size can also be determined from FIG. 6. As shown for the top cell of cell pair 100a, the cell size is $4F \times 4F = 16\ F^2$. The horizontal dimension includes the width of one half of bus bar 106 (only one half of the width is counted for a particular cell because the bus bar 106 is shared with horizontal neighbors as well as the other cell in the cell pair sharing the same device land 108), a spacer region 140, device land 108, another spacer region 140, and one half of bus bar 104. Since the bus bars 104, 106, the spacer regions 140 and the device land 108 are all 1F (or approximately 1F) wide, the total approximate horizontal width is ½F+1F+1F+1F+½F=4F. The vertical dimension of the cell includes the width of the node strap 120, the word line 126, the node neighboring cell, ½ of the isolation region 142 between the device lands 108, and ½ of the 1F center of the device land 108 corresponding to location of the bit line contact 132 (not shown in FIG. 5). Thus, the approximate total vertical width of the cell is also ½F+1F+1F+1F+½F= 4F. It can also be seen from FIG. 6 that the length of each device land 108 is approximately 7F. This includes the width of 2 word lines, 4 node straps (2 for the each cell of the pair and 2 for neighboring cells) and a center region of approximately one feature width to allow for the bit line contact 132.

Figure 7:
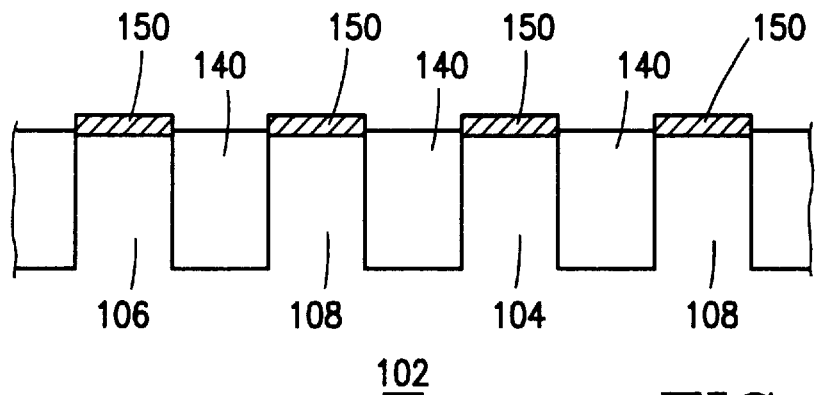
FIG. 7 is a cross-sectional view taken along the line VII—VII from FIG. 4 of the wafer of FIG. 6 at a later stage of processing.

A method for producing the structure 100 shall now be described. FIG. 7 illustrates a cross sectional view taken along the line VII—VII of the silicon wafer 102 of FIG. 4 at an early stage of processing. Buses 104, 106 and device land 108 are formed using an STI (shallow trench isolation process). Specifically, a pad layer 150 (comprising a thin oxide plus a thick nitride) is deposited on the wafer 102. A photomask 200 in the pattern of FIG. 5 is then placed over the pad layer 150. Next, the portions of the wafer and pad layer 150 not covered by the mask 200 are etched to a depth of approximately 0.7 microns to form isolation trenches 140. The resist is then removed. Next the isolation trenches 140 are filled by an oxide using a chemical vapor deposition (CVD) process and the wafer is chemical-mechanical planarized, resulting in the structure shown in FIG. 7. The pad layer 150 is then removed to expose the buses 104, 106 and the device lands 108.

Figure 8:
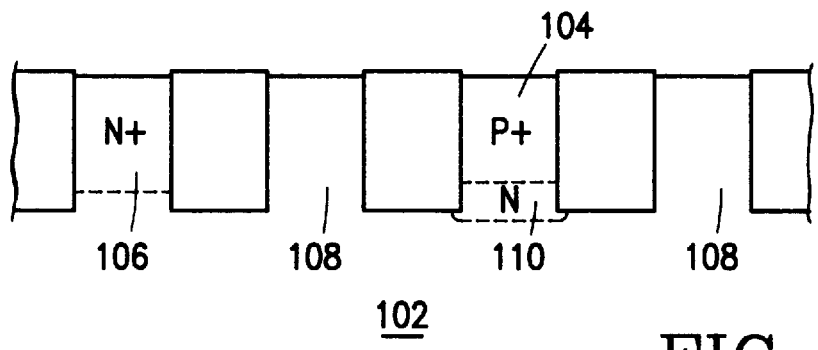
FIG. 8 is a cross-sectional view of the wafer of FIG. 7 at a later stage of processing.

Next, a mask is applied such that only the first voltage bus 104 is exposed. A deep (approx. 0.6 micron) n+ implant (e.g. As or Phos.) is then performed to form region 110 to isolate the first voltage bus 104 from the substrate 102. A heavy Boron implantation of the first voltage bus 104 is then performed to dope the first voltage bus 104. The mask is then stripped and a new mask is applied to expose only the second voltage bus 106, which is then doped with an n+ type implant (e.g. As or Phos.). The mask is then stripped, resulting in the structure shown in FIG. 8.

A thick thermal oxide 151 (approx. 0.1 micron) is then grown or eposited on all exposed silicon. A mask is then applied to expose only the device ands 108. The thermal oxide 151 is then removed from the device lands 108. Then a gate oxide layer 152 is grown or deposited over all exposed silicon areas. A gate conductor layer 154 and nitride cap layer 156 are then deposited as shown in FIG. 9.

Figure 9:
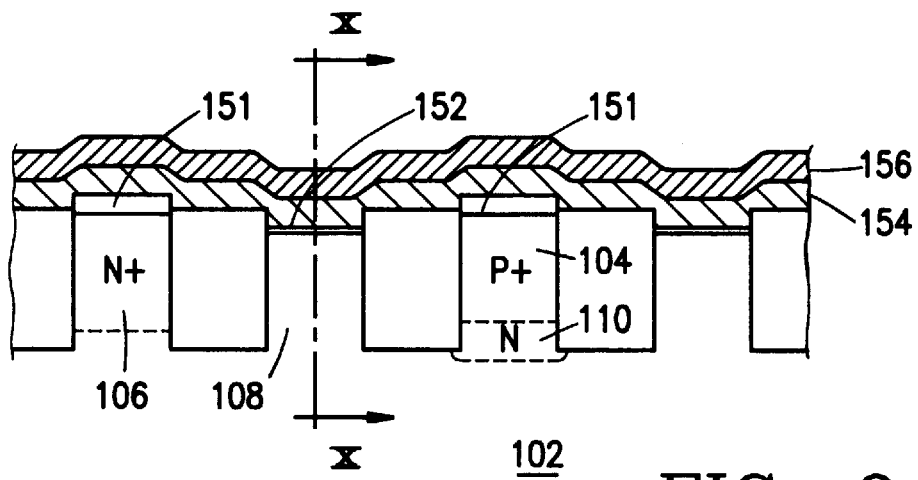
FIG. 9 is a cross-sectional view of the wafer of FIG. 8 at a later stage of processing.
Figure 10:
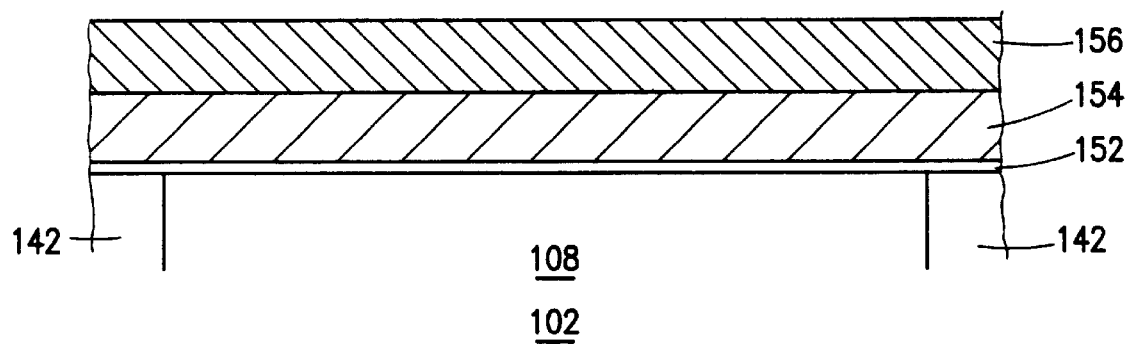
FIG. 10 is a cross-sectional view of the wafer of FIG. 9 taken along the line X—X.

FIG. 10 is a cross-sectional view, at a larger scale, taken along the line X—X of FIG. 9, of the wafer 102 at the stage of processing shown in FIG. 9. The structure shown in FIG. 10 is then masked to define the gate conductors. The exposed portions of the nitride cap and gate conductor layers 156, 154 are then etched, resulting in the gate stacks 158 shown in FIG. 11. A layer of nitride is then deposited and directionally etched to leave nitride spacers 160 on the vertical walls of the gate stacks 158. The source/drain 112, 114 regions are then formed using any conventional technique such as ion implantation. The resulting structure is shown in FIG. 12. Then a thermal oxide layer is deposited (or grown) over the source/drain regions 112, 114.

Figure 11:
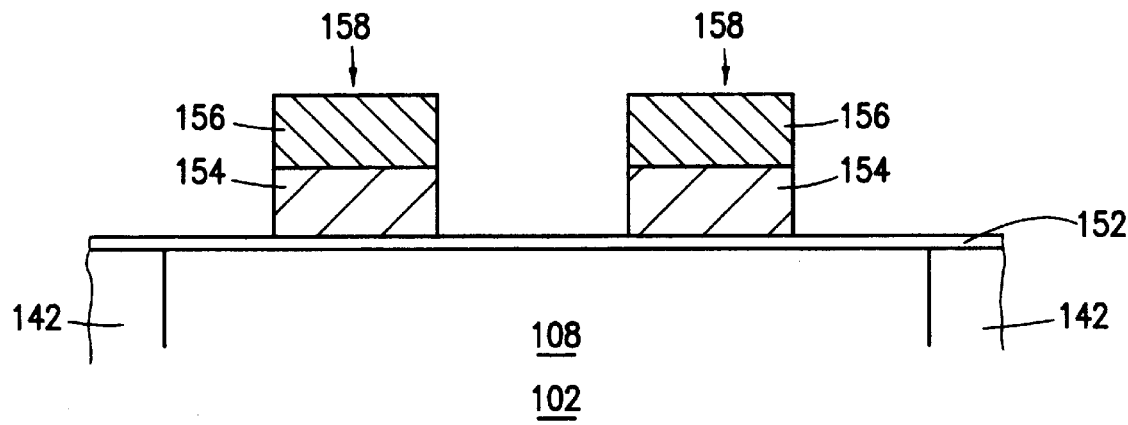
FIG. 11 is a cross-sectional view of the wafer of FIG. 10 at a later stage of processing.

It should be noted here for clarity that the structures shown in FIGS. 10–12 are located along the device land 108. Therefore the transistors formed by the gate stacks 158 and source/drain regions 112, 114 are oriented perpendicularly with respect to the node straps 120 and word lines 126.

Figure 13:
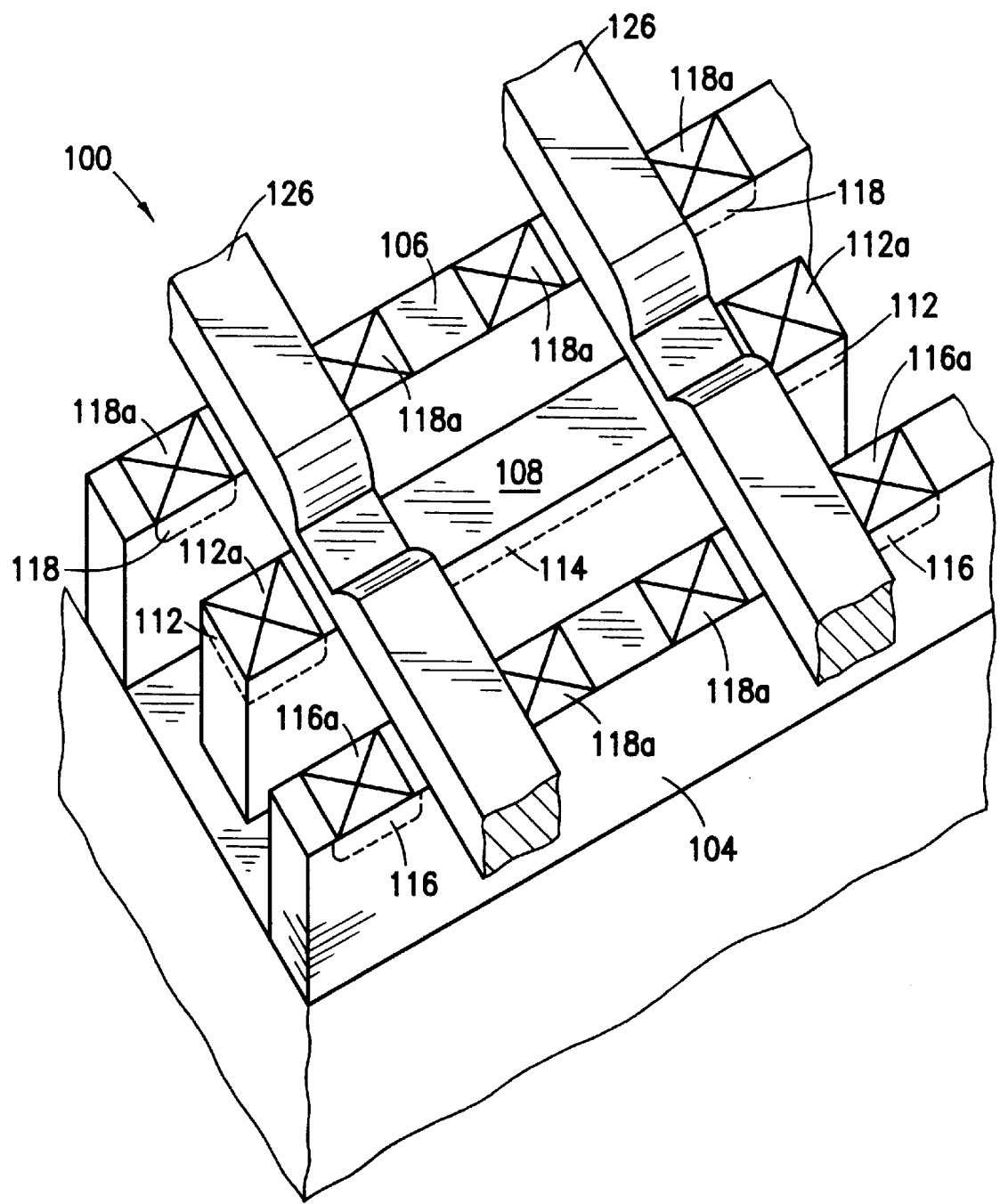
FIG. 13 is a perspective view of the wafer of FIG. 12 at a later stage of processing.

After the thermal oxide layer is grown as discussed above, contact holes 112a, 116a and 118a are etched through the thermal oxide layer as shown in FIG. 13. Contact holes 112a correspond to the locations at which the node straps 120 (not shown in FIG. 13) will eventually contact the source region 112 of the field effect transistors formed on device land 108. Contact holes 116a similarly correspond to the locations at which node straps 120 will eventually contact the n-type region 116 of the first tunnel diode 14 and contact holes 118a correspond to the locations at which node straps 120 will eventually contact the p-type regions 118 of the second tunnel diode 16.

After the contact holes are formed, the structure 100 is then masked such that only the contact holes 116a are uncovered and the exposed silicon is doped to form the n-type regions 116a of the first tunnel diodes 14. The mask is then removed. This process is repeated to form the p-type regions 118a of the second tunnel diodes 16. Then the wafer 102 is annealed to activate the dopants and form the diodes 14, 16. Then a conductive layer (comprising metal in the preferred embodiment) is deposited and etched to form the node straps 120. As in a conventional process, the mask is removed and an interlevel dielectric is deposited. Holes for the bit line contact 132 are then formed and another conductive layer (also comprising metal in the preferred embodiment) is added to form the bit line. The remainder of the processing (e.g. metallic interconnection, passivation, encapsulation, etc.) is conventional and dependent upon the specific application; therefore, the details of further processing will not be discussed further.

Figure 14:
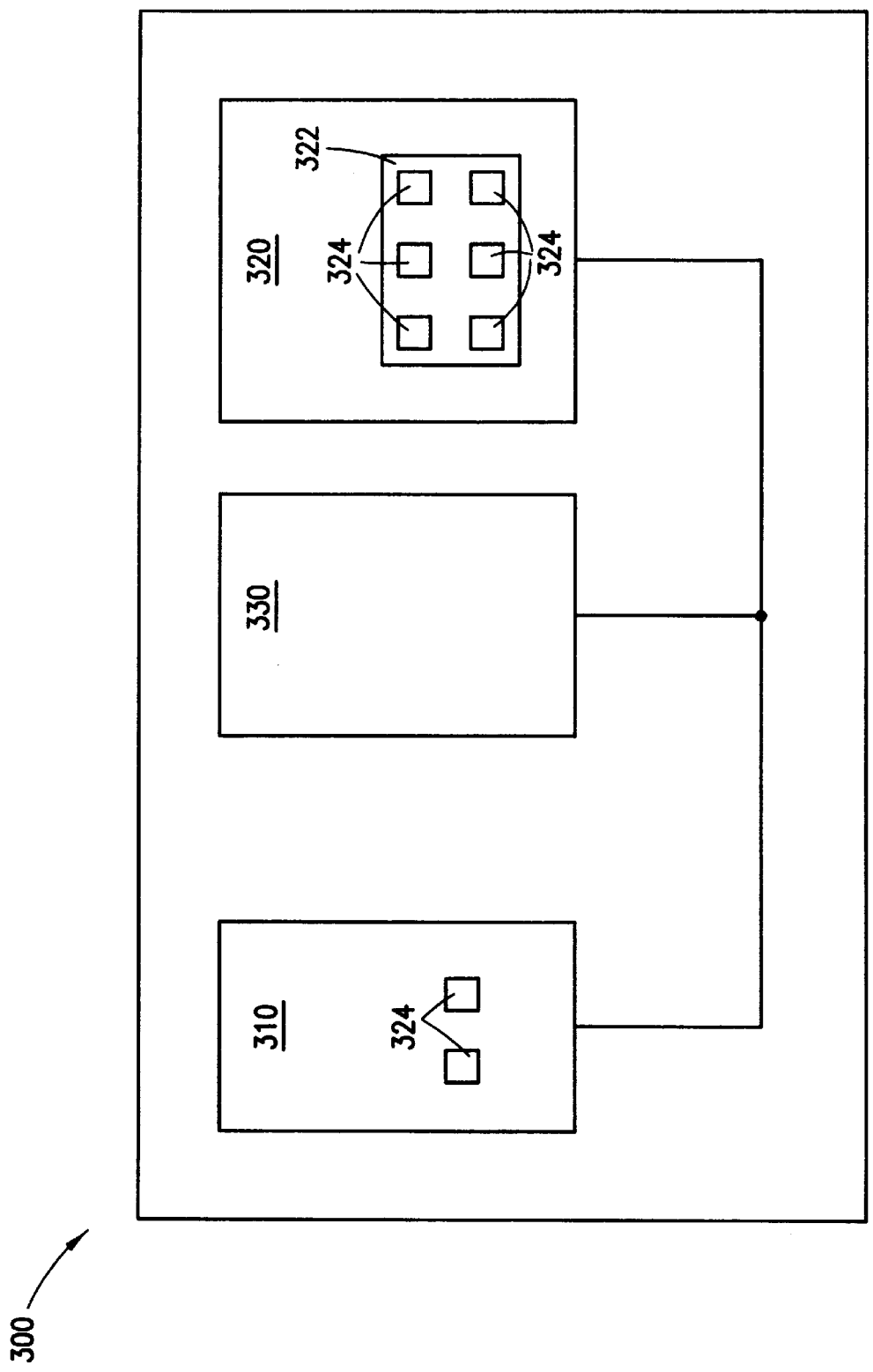
FIG. 14 is a diagram of a computer system incorporating memory cells according to the present invention.

FIG. 14 illustrates a computer system 300 incorporating an SRAM memory cell according to the present invention. The computer system 300 comprises a processor 310, a memory 320 and an I/O device 330. The memory 320 comprises an array 322 of SRAM memory cells 324. The processor 310 may also include on-chip SRAM memory cell circuits fabricated according to the present invention.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method for forming an SRAM cell structure comprising the steps of:
    forming an elongated first voltage bus comprising a material of a first conductivity type;
    forming a first tunnel diode in the first voltage bus by forming a first terminal region of material of a second conductivity type in the first voltage bus;
    forming an elongated second voltage bus comprising a material of the second conductivity type;
    forming a second tunnel diode in the second voltage bus by forming a second terminal region of material of the first conductivity type in the second voltage bus;

forming an elongated device land between the first and second elongated voltage buses;

forming a first transistor on the device land, the transistor having a source, a gate and a drain; and forming a first conductor, the first conductor being configured to form an electrical connection between a source of the first transistor, the first terminal region of the first tunnel diode and the second terminal region of the second tunnel diode.

2. The method of claim 1, wherein the material of the first conductivity type is p-type silicon and the material of the second conductivity type is n-type silicon.

3. The method of claim 2, further comprising a p-type substrate and an isolation region formed between the p-type substrate and the first voltage bus.

4. The method of claim 3, wherein the first voltage bus is connectable to a positive voltage source and the second voltage bus is connectable to ground.

5. The method of claim 1, wherein the second voltage bus, the first voltage bus and the elongated device land are parallel with respect to each other.

6. The method of claim 5, wherein the second voltage bus, the first voltage bus, and the elongated device land are approximately one feature width wide.

7. The method of claim 6, wherein the second voltage bus, the first voltage bus and the elongated device land are separated by approximately one feature width from the closest neighboring second voltage bus, first voltage bus or elongated device land.

8. The method of claim 6, wherein the elongated device land is separated by approximately one feature width from a first voltage bus on one side and is separated by approximately one feature width from a second voltage bus on a second side.

9. The method of claim 8, further comprising a first word line connected to the gate of the first transistor and arranged perpendicularly to the second voltage bus, the first voltage bus and the elongated device land.

10. The method of claim 9, wherein the first word line is approximately one feature width wide and the first conductor is approximately one feature width wide.

11. The method of claim 10, further comprising:

a third terminal region of material of the second conductivity type formed in the first voltage bus such that a third tunnel diode is formed;

a fourth terminal region of material of the first conductivity type formed in the second voltage bus such that a fourth tunnel diode is formed;

a second transistor;

a second word line connected to a gate of the second transistor and arranged in parallel to the first word line; and a second conductor configured to form an electrical connection between a source of the second transistor, the third terminal region of the third tunnel diode and the fourth terminal region of the fourth tunnel diode;

wherein a second transistor is formed on the elongated device land such that the second transistor and the first transistor share a common drain.

12. The method of claim 11, wherein the length of the elongated device land is approximately seven feature widths.

13. The method of claim 12, wherein the size of each cell structure is approximately 16 square feature widths and the size of the entire structure is 32 feature widths.

14. A method for forming a memory circuit comprising the steps of:

forming an array of SRAM cells;

wherein forming the array comprises the steps of:

forming an elongated first voltage bus comprising a material of a first conductivity type;

forming a first tunnel diode in the first voltage bus by forming a first terminal region of material of a second conductivity type in the first voltage bus;

forming an elongated second voltage bus comprising a material of the second conductivity type;

forming a second tunnel diode in the second voltage bus by forming a second terminal region of material of the first conductivity type in the second voltage bus;

forming an elongated device land between the first and second elongated voltage buses;

forming a first transistor on the device land, the transistor having a source, a gate and a drain; and forming a first conductor, the first conductor being configured to form an electrical connection between a source of the first transistor, the first terminal region of the first tunnel diode and the second terminal region of the second tunnel diode.

15. The method of claim 14, wherein the material of the first conductivity type is p-type silicon and the material of the second conductivity type is n-type silicon.

16. The method of claim 15, further comprising a p-type substrate and an isolation region formed between the p-type substrate and the first voltage bus.

17. The method of claim 16, wherein the first voltage bus is connectable to a positive voltage source and the second voltage bus is connectable to ground.

18. The method of claim 17, wherein the second voltage bus, the first voltage bus and the elongated device land are parallel with respect to each other.

19. The method of claim 18, wherein the second voltage bus, the first voltage bus, and the elongated device land are approximately one feature width wide.

20. The method of claim 19, wherein the second voltage bus, the first voltage bus and the elongated device land are separated by approximately one feature width from the closest neighboring second voltage bus, first voltage bus or elongated device land.

21. The method of claim 20, wherein the elongated device land is separated by approximately one feature width from a first voltage bus on one side and is separated by approximately one feature width from a second voltage bus on a second side.

22. The method of claim 21, further comprising a first word line connected to the gate of the first transistor and arranged perpendicularly to the second voltage bus, the first voltage bus and the elongated device land.

23. The method of claim 22, wherein the first word line is approximately one feature width wide and the first conductor is approximately one feature width wide.

24. The method of claim 23, further comprising:

a third terminal region of material of the second conductivity type formed in the first voltage bus such that a third tunnel diode is formed;

a fourth terminal region of material of the first conductivity type formed in the second voltage bus such that a fourth tunnel diode is formed;

a second transistor;

a second word line connected to a gate of the second transistor and arranged in parallel to the first word line; and a second conductor configured to form an electrical connection between a source of the second transistor, the third terminal region of the third tunnel diode and the fourth terminal region of the fourth tunnel diode;

wherein a second transistor is formed on the elongated device land such that the second transistor and the first transistor share a common drain.

25. The method of claim 24, wherein the length of the elongated device land is approximately seven feature widths.

26. The method of claim 25, wherein the size of each cell structure is approximately 16 square feature widths and the size of the entire structure is 32 feature widths.

27. A method of making a computer system comprising the steps of:

providing a processor;

forming a memory circuit; and connecting the processor and memory circuit;

wherein forming the memory circuit comprises the steps of:

forming an elongated first voltage bus comprising a material of a first conductivity type;

forming a first tunnel diode in the first voltage bus by forming a first terminal region of material of a second conductivity type in the first voltage bus;

forming an elongated second voltage bus comprising a material of the second conductivity type;

forming a second tunnel diode in the second voltage bus by forming a second terminal region of material of the first conductivity type in the second voltage bus;

forming an elongated device land between the first and second elongated voltage buses;

forming a first transistor on the device land, the transistor having a source, a gate and a drain; and forming a first conductor, the first conductor being configured to form an electrical connection between a source of the first transistor, the first terminal region of the first tunnel diode and the second terminal region of the second tunnel diode.

28. The method of claim 27, wherein the material of the first conductivity type is p-type silicon and the material of the second conductivity type is n-type silicon.

29. The method of claim 28, further comprising a p-type substrate and an isolation region formed between the p-type substrate and the first voltage bus.

30. The method of claim 29, wherein the first voltage bus is connectable to a positive voltage source and the second voltage bus is connectable to ground.

31. The method of claim 27, wherein the second voltage bus, the first voltage bus and the elongated device land are parallel with respect to each other.

32. The method of claim 31, wherein the second voltage bus, the first voltage bus, and the elongated device land are approximately one feature width wide.

33. The method of claim 32, wherein the second voltage bus, the first voltage bus and the elongated device land are separated by approximately one feature width from the closest neighboring second voltage bus, first voltage bus or elongated device land.

34. The method of claim 33, wherein the elongated device land is separated by approximately one feature width from a first voltage bus on one side and is separated by approximately one feature width from a second voltage bus on a second side.

35. The method of claim 34, further comprising a first word line connected to the gate of the first transistor and arranged perpendicularly to the second voltage bus, the first voltage bus and the elongated device land.

36. The method of claim 35, wherein the first word line is approximately one feature width wide and the first conductor is approximately one feature width wide.

37. The method of claim 36, further comprising:

a third terminal region of material of the second conductivity type formed in the first voltage bus such that a third tunnel diode is formed;

a fourth terminal region of material of the first conductivity type formed in the second voltage bus such that a fourth tunnel diode is formed;

a second transistor;

a second word line connected to a gate of the second transistor and arranged in parallel to the first word line; and a second conductor configured to form an electrical connection between a source of the second transistor, the third terminal region of the third tunnel diode and the fourth terminal region of the fourth tunnel diode;

wherein a second transistor is formed on the elongated device land such that the second transistor and the first transistor share a common drain.

38. The method of claim 37, wherein the length of the elongated device land is approximately seven feature widths.

39. The method of claim 38, wherein the size of each cell structure is approximately 16 square feature widths and the size of the entire structure is 32 feature widths.

40. The method of claim 39, wherein the processor is provided on the same chip as the memory circuit.

* * * * *